(12) United States Patent
Link et al.

(10) Patent No.: US 8,491,957 B2
(45) Date of Patent: Jul. 23, 2013

(54) METHOD FOR PRODUCING A POLYCRYSTALLINE CERAMIC FILM ON A SUBSTRATE USING A SHUTTER

(75) Inventors: Mathias Link, Luxembourg (LU); Matthias Schreiter, München (DE)

(73) Assignee: Siemens Aktiengesellschaft, Munich (DE)

( * ) Notice: Subject to any disclaimer, the term of this patent is extended or adjusted under 35 U.S.C. 154(b) by 853 days.

(21) Appl. No.: 12/161,517

(22) PCT Filed: Jan. 16, 2007

(86) PCT No.: PCT/EP2007/050368
§ 371 (c)(1),
(2), (4) Date: Jul. 18, 2008

(87) PCT Pub. No.: WO2007/085549
PCT Pub. Date: Aug. 2, 2007

(65) Prior Publication Data
US 2010/0242578 A1    Sep. 30, 2010

(30) Foreign Application Priority Data

Jan. 26, 2006 (DE) .......................... 10 2006 003 847

(51) Int. Cl.
*H01G 7/00* (2006.01)
(52) U.S. Cl.
USPC ........................................................ 427/100
(58) Field of Classification Search
USPC ........................................ 29/25.35; 427/100
See application file for complete search history.

(56) References Cited

U.S. PATENT DOCUMENTS 4,640,756 A    2/1987   Wang et al. .............. 204/192.18
4,704,199 A *  11/1987  Yokokawa et al. ...... 204/298.03
(Continued)

FOREIGN PATENT DOCUMENTS

DD    238815     9/1986
EP    0469926    8/1991
(Continued)

OTHER PUBLICATIONS

Gabl et al., "First Results on Label-Free Detection of DNA and Protein Molecules Using a Novel Integrated Sensor Technology Based on Gravimetric Detection Principles", Biosensors and Bioelectronics, No. 19, 2004.*

(Continued)

*Primary Examiner* — David Rogers
(74) *Attorney, Agent, or Firm* — King & Spalding L.L.P.

(57) ABSTRACT

In a method for production of a polycrystalline ceramic film on a substrate: a) the substrate is prepared with the substrate surface and preparation of at least one source for the ceramic particles of the ceramic film and b) a particle stream of the ceramic particles is generated from the source of ceramic particles in the direction of the substrate surface on the substrate, with deposition of the ceramic particles on the substrate surface on the substrate with formation of the ceramic film. At least one screen is arranged within the gap, for adjusting an average incidence angle of the ceramic particles relative to a plane normal of the substrate surface, such that the ceramic particles are deposited on the substrate surface at a preferred direction and a relative position of the substrate surface and the screen is altered while the gap remains essentially the same.

17 Claims, 2 Drawing Sheets

U.S. PATENT DOCUMENTS

| | | | |
|---|---|---|---|
| 4,946,576 A * | 8/1990 | Dietrich et al. | 204/298.06 |
| 5,875,531 A * | 3/1999 | Nellissen et al. | 29/25.35 |
| 6,210,540 B1 | 4/2001 | Hichwa | |
| 6,685,994 B1 | 2/2004 | Karner et al. | 427/569 |
| 7,008,669 B2 * | 3/2006 | Natori et al. | 427/126.3 |
| 7,010,837 B2 * | 3/2006 | Takata et al. | 29/25.35 |
| 7,213,322 B2 * | 5/2007 | Nakagawara et al. | 29/594 |
| 2004/0216993 A1 | 11/2004 | Sandhu | 204/192.12 |
| 2005/0129848 A1 | 6/2005 | Choi et al. | 427/249.1 |
| 2005/0145477 A1 | 7/2005 | Kaas et al. | 204/192.12 |
| 2005/0270636 A1 * | 12/2005 | Yasaki et al. | 359/359 |
| 2006/0125489 A1 * | 6/2006 | Feucht et al. | 324/633 |
| 2006/0249372 A1 * | 11/2006 | Xiang et al. | 204/192.11 |
| 2007/0178225 A1 * | 8/2007 | Takanosu et al. | 427/69 |
| 2007/0190235 A1 * | 8/2007 | Yamazaki et al. | 427/64 |
| 2007/0290601 A1 * | 12/2007 | Lo et al. | 313/496 |
| 2008/0081115 A1 * | 4/2008 | Yamazaki et al. | 427/294 |
| 2008/0197016 A1 * | 8/2008 | Takizawa et al. | 204/298.02 |
| 2008/0233272 A1 * | 9/2008 | Ibe et al. | 427/66 |
| 2008/0282984 A1 * | 11/2008 | Yamazaki et al. | 118/728 |
| 2009/0058285 A1 * | 3/2009 | Yamazaki et al. | 313/504 |
| 2009/0065741 A1 * | 3/2009 | Walls et al. | 252/301.35 |
| 2009/0074952 A1 * | 3/2009 | Yamazaki et al. | 427/70 |
| 2009/0079442 A1 * | 3/2009 | Gabl et al. | 324/663 |

FOREIGN PATENT DOCUMENTS

| | | |
|---|---|---|
| EP | 1350863 | 10/2003 |
| WO | 0066806 | 11/2000 |
| WO | 03078677 | 9/2003 |
| WO | 2004/067797 | 8/2004 |
| WO | 2006/103134 | 10/2006 |

OTHER PUBLICATIONS

Nakamura et al., "Improvement in the Crystallinity of ZnO Thin Films by Introdcution of a Buffer Layer", Thin Solid Films, No. 411, 2002.*

Wang et al., "Sputtered C-Axis Inclined ZnO Films for Shear Wave Resonators", Ultrasonics Symposium, 1982.*

Yamada et al., Improvement of Crystallinity of ZnO Thin Film and Electrical Characteristics of Film Bulk Acoustic Wave Resonator by Using Pt Buffer Layer, Vacuum, No. 74, 2004.*

J.S. Wang et al.; "Sputter C-Axis Inclined Piezoelectric Films and Shear Wave Resonators"; IEEE; pp. 144-150, 1983.

K. Kalantar-Zadeh et al.; "Novel Love Mode Surface Acoustic Wave Based Immunosensors"; Sensors and Actuators B; Elesevier Sequoia S.A., Lausanne, CH, vol. 91, No. 1-3, pp. 143-137, Jun. 1, 2003.

International Search Report; PCT/EP2007/050368; pp. 3, Oct. 29, 2007.

* cited by examiner

METHOD FOR PRODUCING A POLYCRYSTALLINE CERAMIC FILM ON A SUBSTRATE USING A SHUTTER

CROSS-REFERENCE TO RELATED APPLICATIONS

This application is a U.S. national stage application of International Application No. PCT/EP2007/050368 filed Jan. 16, 2007, which designates the United States of America, and claims priority to German application number 10 2006 003 847.9 filed Jan. 26, 2006, the contents of which are hereby incorporated by reference in their entirety.

TECHNICAL FIELD

The invention relates to a method for producing a polycrystalline ceramic film on a substrate surface of a substrate with the following method steps: a) provision of the substrate with the substrate surface and provision of at least one source for ceramic particles of the ceramic film, the substrate surface and sources being arranged at a distance from one another and b) generation of a particle stream of the ceramic particles from the source of the ceramic particles in the direction of the substrate surface of the substrate, the ceramic particles being deposited on the substrate surface of the substrate and the ceramic film thus being formed. In addition to the method, a device for producing the polycrystalline ceramic film, a capacitor structure with the ceramic film and use of the capacitor structure are also specified.

BACKGROUND

A method of the type mentioned in the introduction for producing the polycrystalline ceramic film on the substrate surface of a substrate and a capacitor structure with the ceramic film are known for example from WO 2004/067797 A1. The capacitor structure has a lower electrode layer arranged on the substrate, an upper electrode layer and a polycrystalline piezoelectric ceramic layer arranged between the electrode layers. The capacitor structure (thin layer capacitor) forms a so-called piezoacoustic thin film resonator (Film Bulk Acoustic Resonator, FBAR). The crystalline piezoelectric ceramic layer is formed by the polycrystalline ceramic film. The ceramic film consists of zinc oxide (ZnO). The electrode layers are made of platinum for example. The electrode layers and the piezoelectric layer are arranged adjacent to one another in such a manner that electrical activation of the electrode layers with an electric alternating field results due to the piezo-effect in (acoustic) oscillation of the ceramic film and therefore oscillation of the resonator at a specific resonant frequency. The resonant frequency of the oscillation of the resonator is a function of the layer thicknesses of the layers of the capacitor structure. The mode of oscillation (thickness longitudinal oscillation or thickness shear oscillation) stimulated is a function of a crystal structure of the zinc oxide single crystals and a relative alignment of the zinc oxide single crystals in relation to the applied electric alternating field.

A vapor deposition method is used to generate the layers of the capacitor structure on a substrate, for example a silicon substrate. The lower electrode layer, of polycrystalline platinum for example, is first deposited on the silicon substrate. Zinc oxide is deposited on the lower platinum electrode layer. Without additional measures zinc oxide single crystals grow with a (002) orientation. This means that the polar c-axis of the zinc oxide is oriented perpendicular to the substrate surface or electrode surface. The resulting resonator can therefore be optimally stimulated to thickness longitudinal oscillations.

The known resonator is used to detect a substance in a fluid. To this end the fluid is conducted past a surface segment of the resonator, with the substance to be detected being absorbed on the surface segment. Absorption results in a change in the mass of the resonator and therefore a change in the resonant frequency of the resonator.

If a fluid in the form of a liquid is to be investigated and if the resonant frequency of the resonator is to be determined as the fluid is conducted past, it is particularly advantageous to be able to stimulate the known resonator to thickness shear oscillations. Thickness shear oscillations are virtually not dampened by the fluid, resulting in a relatively high resonator quality and therefore a relatively high level of detectability for the substance in the fluid, compared with thickness longitudinal oscillations. To this end the zinc oxide single crystals have to grow at an angle. The so-called IBAD (Ion Beam Assisted Deposition) method is used according to WO 2004/067797 A1 to adjust the angled preferred direction. While the zinc oxide ceramic film is being deposited, an ion beam, for example a beam of $Ar^+$ ions is directed obliquely onto the substrate surface. The angled growth of the zinc oxide single crystals is achieved with the aid of the ion beam. However the IBAD method is very complex. As an alternative to the IBAD method an angled preferred direction can be achieved by epitactic growth on a suitable single-crystal substrate. This is only possible in a very limited frame. Therefore the crystal structures of the substrate and the ceramic film for example have to be tailored so that epitactic growth is possible. It is also possible to arrange the substrate, on which the ceramic film is to be deposited, obliquely in the particle stream. However this method is only suitable for a relatively small substrate. Use of this method is likewise only possible to a restricted degree.

SUMMARY

A method for producing a polycrystalline ceramic film, which is simpler and can be used in a more flexible manner compared with the known methods may, according to an embodiment, comprise the following steps: a) providing the substrate with the substrate surface and providing at least one source for ceramic particles of the ceramic film, the substrate surface and sources being arranged at a distance from one another and b) generating a particle stream of the ceramic particles from the source of the ceramic particles in the direction of the substrate surface of the substrate, the ceramic particles being deposited on the substrate surface of the substrate and the ceramic film thus being formed, (c) arranging within the gap at least one shutter for adjusting a mean angle of incidence of the ceramic particles in relation to a surface normal of the substrate surface, so that the ceramic particles are deposited on the substrate surface in a preferred direction and a relative position of the substrate surface and the shutter to one another is changed, while the gap remains essentially the same.

According to a further embodiment, the relative position can be changed by swinging the shutter and/or the substrate. According to a further embodiment, the mean angle of incidence can be selected from the range from 0° to 90° inclusive and in particular from the range from 10° to 30° inclusive. According to a further embodiment, a gap can be selected between the substrate surface and the source of the ceramic particles, which is smaller than a mean free path length of the ceramic particles of the particle stream. According to a further embodiment, an electric field can be generated with the aid of the shutter, said electric field being used to help to influence the angle of incidence. According to a further embodiment, a number of shutters can be arranged between the substrate surface of the substrate and the source of the ceramic particles. According to a further embodiment, a ceramic film can be produced with a ceramic selected from the group aluminum nitride and/or zinc oxide. According to a further embodiment, a substrate with an amorphous substrate surface can be used. According to a further embodiment, a substrate can be used with a substrate surface, which is formed by at least one material selected from the group aluminum oxide, silicon dioxide, titanium dioxide and/or zirconium dioxide.

According to another embodiment, a device for producing a polycrystalline ceramic film on a substrate surface of a substrate may comprise: at least one source support to hold a source for ceramic particles of the ceramic film, at least one substrate support to hold the substrate in a support gap in relation to the source support, at least one shutter arranged between the source support and the substrate support to adjust a mean angle of incidence of the ceramic particles in relation to a surface normal of the substrate surface of the substrate to be supported by the substrate support and—at least one facility for changing a relative position of the source support and the substrate support to one another, with the facility being configured so that when the relative position changes, the support gap between the source support and the substrate support remains essentially the same.

In particular, according to an embodiment, the method can be suitable for producing a thin film resonator, which can be used to detect a substance in a liquid medium. According to an embodiment, a capacitor structure may comprise such a dielectric polycrystalline layer with ceramic particles with a specific preferred direction, and may further comprise a lower electrode layer arranged on a substrate, and an upper electrode layer, wherein the dielectric polycrystalline layer with ceramic particles with a specific preferred direction is arranged between the electrode layers. According to yet another embodiment, a method of using such a capacitor structure as a piezoacoustic resonator, may comprise the steps: arranging the dielectric, polycrystalline layer and the electrode layers adjacent to one another in such a manner that electrical activation of the electrode layers results in oscillation of the resonator at a specific resonant frequency.

According to a further embodiment, the resonant frequency of the oscillation may be selected from the range from 100 MHz to 10 GHz inclusive and in particular from the range from 500 MHz to 10 GHz inclusive. According to a further embodiment, the method may be used for detecting at least one substance in a fluid, and may comprise the following method steps: a') bringing together the fluid and the piezoacoustic resonator in such a manner that the substance can be absorbed on the surface segment of the resonator and b') determining a resonant frequency of the resonator, with the quantity of the substance absorbed on the surface segment being concluded from the resonant frequency. According to a further embodiment, a surface segment for absorbing a substance in a fluid may be arranged on the resonator in such a manner that the resonant frequency of the resonator is a function of a quantity of the substance absorbed on the surface segment. According to a further embodiment, the surface segment for absorbing the substance in the fluid may be formed by a chemically sensitive coating of the resonator. According to a further embodiment, the resonant frequency may be determined in the presence of the fluid.

BRIEF DESCRIPTION OF THE DRAWINGS

The invention is described in more detail below with reference to a number of exemplary embodiments and the associated figures. The figures are schematic and do not represent scale images.

DETAILED DESCRIPTION

Figure 1:
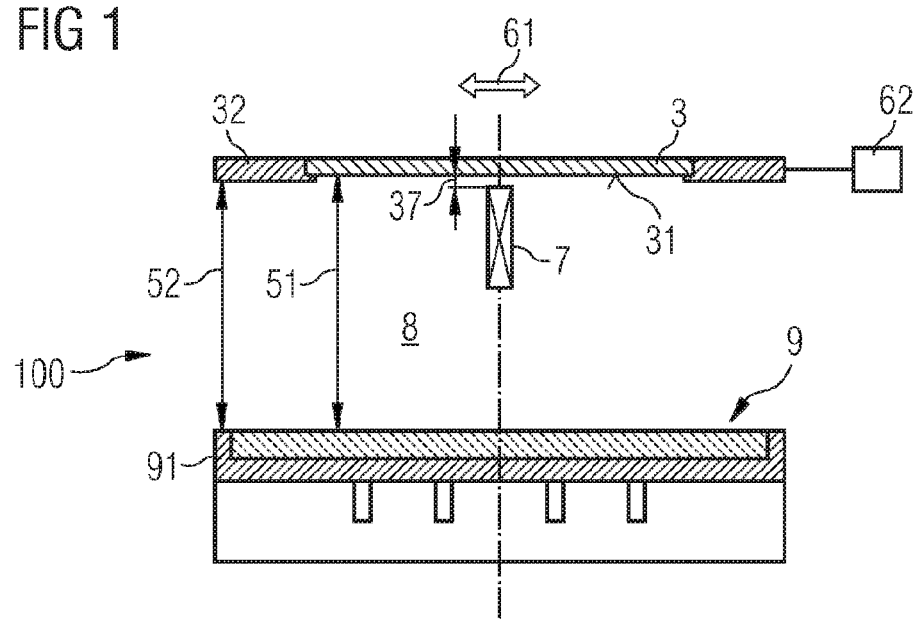
FIG. 1 shows a device for producing a polycrystalline ceramic film on a substrate surface of a substrate viewed in cross-section from the side.

A method for producing a polycrystalline ceramic film on a substrate surface of a substrate may have the following method steps: a) provision of the substrate with the substrate surface and provision of at least one source for ceramic particles of the ceramic film, the substrate surface and sources being arranged at a distance from one another and b) generation of a particle stream of the ceramic particles from the source of the ceramic particles in the direction of the substrate surface of the substrate, the ceramic particles being deposited on the substrate surface of the substrate and the ceramic film thus being formed. The method may have the further step wherein at least one shutter for adjusting a mean angle of incidence of the ceramic particles in relation to a surface normal of the substrate surface is arranged within the gap, so that the ceramic particles are deposited on the substrate surface in a preferred direction and a relative position of the substrate surface and the shutter to one another is changed, while the gap remains essentially the same.

A device for producing a polycrystalline ceramic film on a substrate surface of a substrate with the following device elements may comprise: at least one source support to hold a source for ceramic particles of the ceramic film, at least one substrate support to hold the in a support gap in relation to the source support, at least one shutter arranged between the source support and the substrate support to adjust a mean angle of incidence of the ceramic particles in relation to a surface normal of the substrate surface of the substrate to be held by the substrate support and at least one facility for changing a relative position of the source support and the substrate support to one another, with the facility being configured so that when the relative position changes, the support gap between the source support and the substrate support remains essentially the same.

The surface normal is not a microscopic but a macroscopic surface normal of a substrate surface. The substrate surface is formed for example by a main face of the substrate. Microroughness of the substrate surface is and therefore individual microscopic substrate surface segments are not taken into account. The macroscopic surface normal is in the manner of a surface normal averaged over all the normals occurring along the substrate surface.

According to various embodiments a mechanical shutter is arranged in proximity to the substrate surface of the substrate. This shutter shades off certain angles of incidence of the ceramic particles. Also the relative position of the substrate surface and shutter to one another is changed. This may be preferably achieved by a swinging movement of the substrate and/or shutter. In one particular embodiment therefore the relative position can be changed by swinging the shutter and/or the substrate. The shading off of certain angles of incidence means that the ceramic particles (ceramic single crystals) grow in a preferred direction on the substrate surface. Changing the relative position and/or the swinging movement ensures that that the ceramic film grows homogeneously. This means that the orientation of the single crystals is essentially the same over the entire substrate. In particular an essentially uniform layer thickness of the ceramic film may also be achieved over the entire substrate. The differences are maximum 10% and in particular maximum 5%. The substrate can be large here. This means that the substrate has a diameter of up to 50 cm. The diameter is six inches (around 15 cm) for example.

The mean angle of incidence can be preferably selected from the range from 0° to 90° inclusive and in particular from the range from 10° to 30° inclusive.

The source can hereby have the ceramic, from which the particle stream is generated in the direction of the substrate surface solely by material removal. It is however also possible for the source to have a preliminary stage of the ceramic, which is converted to the ceramic in a reactive step. For example the source has elementary zinc, which is removed in a sputter unit and is converted to zinc oxide in the presence of oxygen.

According to a second aspect a capacitor structure may be specified with a lower electrode layer arranged on a substrate, an upper electrode layer, a dielectric, polycrystalline ceramic film with ceramic particles with a specific preferred direction in relation to the substrate surface, arranged between the lower and upper electrode layers, being produced according to the method described above.

According to a further aspect use of the capacitor structure as a piezoacoustic resonator may be specified. Here the ceramic film forms a piezoelectric layer of the resonator. The piezoelectric layer and the electrode layers are arranged adjacent to one another in such a manner that electrical activation of the electrode layers results in oscillation of the resonator at a specific resonant frequency.

Deposition from a vapor phase is carried out to generate the ceramic film. The deposition from the vapor phase can be any physical vapor deposition (Physical Vapor Deposition, PVD). For example the ceramic film is generated by sputtering. The sputtering is for example magnetron sputtering.

It may be particularly advantageous if it is ensured that the surface mobility of the deposited ceramic particles is as low as possible. Low surface mobility means that the ceramic particles cannot or can barely re-orient themselves. The orientations of the ceramic particles on the substrate surface are therefore maintained. Low surface mobility can be achieved for example by keeping the substrate temperature of the substrate surface as low as possible.

It may be particularly advantageous to select the gap between the substrate surface and the source of the ceramic particles to be smaller than a mean free path length of the ceramic particles of the particle stream. The mean free path length here is the path covered by a particle, within the limits of which re-orientation or a change in the direction of a ceramic particle does not take place on the path from the source to the substrate surface. It is thus ensured that there is no distribution of the orientation of the ceramic particles. In the case of a magnetron sputter unit the mean free path length is a function of the gas pressure of the gases involved. The mean free path length is typically a few cm, for example 10 cm.

In one particular embodiment the shutter can be used to generate an electric field, which can be used to influence the growth of the single crystals. For the ceramic particles to be taken up in an aligned manner, it is of decisive importance that the angle of incidence of the ceramic particles can be adjusted specifically. The shutter may be used for this purpose. However the shutter can also be used to adjust the electric field, in whose area of influence the ceramic particles strike the substrate surface. For example the ceramic particles have an outwardly effective electric dipole moment. The ceramic particles are aligned in the electric field based on the electric dipole moment. Two parameters are therefore available for adjusting the angle of incidence of the ceramic particles: the shutter can be used to shade off certain angles of incidence. The shutter can also be used to generate an electric field, which also helps to orient the ceramic particles.

A single shutter can be provided for a substrate. It is however also possible to use more than one shutter per substrate. It is likewise possible to use shutters of any form, for example round, rectangular or star-shaped shutters. It is thus possible to generate any incidence pattern and therefore any orientation pattern on the substrate surface of a substrate.

In one particular embodiment a ceramic film can be produced with a ceramic selected from the group aluminum nitride (AlN) and/or zinc oxide (ZnO). By depositing the ceramic particles in an aligned manner it is possible to produce so-called thin film resonators, which can be stimulated to thickness shear oscillations. The thin film resonator is therefore suitable for use in liquids.

To adjust an oriented growth on the substrate surface it may be also advantageous to use a substrate with an amorphous substrate surface. This prevents there being no permanently predefined preferred direction of growth. A substrate with a substrate surface, which is formed by at least one material may be selected from the group aluminum oxide ($Al_2O_3$), silicon dioxide ($SiO_2$), titanium dioxide ($TiO_2$) and/or zirconium oxide ($ZrO_2$) is particularly suitable for aluminum nitride and zinc oxide. These materials can be deposited amorphously on platinum for example. A thin layer is generated (film thickness from 20 mm to 500 mm). The polycrystalline ceramic film is deposited on this amorphous dielectric layer. Since the dielectric layer (intermediate layer) is amorphous, there is no epitactic growth of the ceramic single crystals. No preferred direction is predefined for the growth of the ceramic single crystals. It is thus possible to adjust the angle of the growing ceramic single crystals as required.

The amorphous intermediate layer in particular allows angling of the polar crystal axis of zinc oxide. It is thus possible with an angle of 40° to stimulate the thin film resonator to pure thickness shear oscillations. But even with a smaller angle, for example an angle of 16°, a resonator results, which can be stimulated to thickness shear oscillations and which also has a sufficiently high level of detectivity in the presence of a fluid to be investigated.

The described method gives access to a novel capacitor structure with a lower electrode layer arranged on a substrate, an upper electrode layer, an amorphous intermediate layer forming the substrate surface and arranged on the lower electrode layer and a dielectric, polycrystalline ceramic film deposited on the substrate surface according to the method described above.

In one particular embodiment the polycrystalline ceramic film, in particular the ceramic film made of zinc oxide, has a layer thickness selected from the range from 0.05 µm to 20 µm inclusive and in particular from 0.1 µm to 20 µm inclusive. The swinging movement means that the layer thickness is essentially the same over the entire substrate. Differences in layer thickness are maximum 10% and in particular maximum 5%. The resonant frequency of the oscillation of the resonator realized with the capacitor structure is preferably selected from the range from 100 MHz to 10 GHz inclusive and in particular from 500 MHz to 10 GHz inclusive. This measure results in a particularly high mass sensitivity in respect of the substance.

Any electrode material can be used as the electrode material for the lower electrode layer. In one particular embodiment the lower electrode layer may have an electrode material selected from the group tungsten and/or platinum. These electrode materials have proven to be effective for the use of semiconductor substrates.

Any electrode material can likewise be used as the electrode material for the upper electrode layer. It may be particularly advantageous to select the electrode material of the upper electrode from the group aluminum and/or gold. In particular when gold is used, it is possible to use the upper electrode layer as a chemically sensitive coating to absorb the substance in the fluid. The substance has sulfur atoms for example. This means that sulfur-gold compounds can form so that the substance is absorbed.

Any substrate can be used as the substrate (support body for the capacitor structure). The substrate may be preferably a semiconductor substrate with a semiconductor material. In particular the semiconductor material is selected from the group silicon and/or gallium arsenide. The substrate can hereby be single crystalline or polycrystalline. The semiconductor materials mentioned are suitable for the application of bipolar and CMOS (Complementary Metal Oxide Semiconductor) technology for integrating activation and/or evaluation facilities of the resonator.

At least one facility is preferably present to insulate the thin film resonator and the substrate acoustically from one another. The thin film resonator and the substrate are insulated acoustically from one another. The acoustic insulation ensures that energy remains in the thin film resonator and is not dissipated by way of the substrate. This results in a relatively high mass sensitivity. The acoustic insulation facility is preferably a Bragg reflector, which consists of $\lambda/4$ thick layers of different acoustic impedance. Alternatively the facility is formed by a hollow space in the substrate.

The capacitor structure can be used as a piezoacoustic resonator, with the dielectric, polycrystalline layer and the electrode layers being arranged adjacent to one another in such a manner that electrical activation of the electrode layers results in oscillation of the resonator at a specific resonant frequency. According to one particular embodiment the resonant frequency of the oscillation may be selected from the range from 100 MHz to 10 GHz inclusive and in particular from the range from 500 MHz and 10 GHz inclusive. The capacitor structure may be used to detect a substance in a fluid. The fluid can be gaseous. The fluid is preferably a liquid. The following method steps are implemented to detect the substance: a') bringing together the fluid and the piezoacoustic resonator in such a manner that the substance can be absorbed on the surface segment of the resonator and b') determining a resonant frequency of the resonator, with the quantity of the substance absorbed on the surface segment being concluded from the resonant frequency. In this process a surface segment for absorbing a substance in a fluid is arranged on the resonator in such a manner that the resonant frequency of the resonator is a function of a quantity of the substance absorbed on the surface segment. The surface segment can hereby be formed by the upper electrode layer, for example an electrode layer made of gold (see above). It is also possible in particular for the surface segment to be formed by a chemically sensitive coating on the resonator.

The resonant frequency can be determined after absorption has taken place in the absence of the fluid. Since the invention gives access to a resonator, which can be stimulated to thickness shear oscillations, the resonant frequency is preferably determined in the presence of the fluid.

To summarize, the following advantages should be highlighted:

The shutter is used to shade off certain unwanted angles of incidence of the ceramic particles.

Changing the relative position of the shutter and the substrate to one another makes a homogenous ceramic film accessible even over a large substrate surface.

Figure 4:
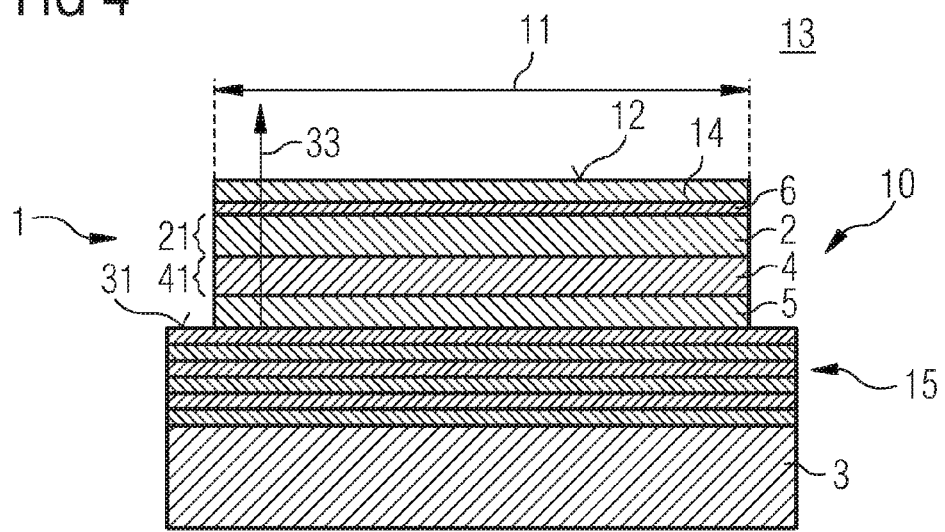
FIG. 4 shows a capacitor structure with the polycrystalline ceramic film in a lateral cross-section.

According to a first exemplary embodiment a capacitor structure 1 (FIG. 4) is produced with a polycrystalline piezoelectric ceramic film 2. The ceramic film 2 is made of zinc oxide (zinc oxide film). The entire capacitor structure 1 is applied to a semiconductor substrate 3 made of silicon. The zinc oxide film 2 forms the capacitor structure 1 together with the electrode layers 5 and 6. An amorphous dielectric layer 4 made of aluminum oxide is present between the lower electrode layer 5 and the zinc oxide film 2. The intermediate layer thickness 41 of the intermediate layer 4 is around 50 nm.

The capacitor structure 1 is used to detect a substance in a fluid 13. To this end the capacitor structure 1 is embodied to form a piezoacoustic thin film resonator 10, which is applied to the substrate surface 31 of the semiconductor substrate 3. The layer thickness 21 of the zinc oxide film 2 is around 0.4 μm. The lateral extension 11 of the resonator 10 is approximately 100 μm.

The electrode layers 5 and 6 are arranged on two sides of the zinc oxide film 2 facing away from one another. The layer thickness of the lower electrode layer 5 is around 0.5 μm. The layer thickness of the upper electrode layer 6 is around 0.1 μm. The lower electrode layer 5 is made of platinum. The upper electrode layer 6 is made of gold.

The zinc oxide film 2 consists of a plurality of zinc oxide single crystals. The zinc oxide single crystals are angled toward the substrate surface 31 or the macroscopic surface normal 33 of the semiconductor substrate 3. The resonator 10 formed with the capacitor structure 1 can thus be stimulated to thickness shear oscillations parallel to the substrate surface 31.

The resonator 10 has a surface segment 12, on which a substance in a fluid 13 can be absorbed. To this end the resonator 10 has a chemically sensitive coating 14. The chemically sensitive coating 14 is applied to the electrode 6.

To increase the mass sensitivity of the resonator 10 for a specific substance, the semiconductor substrate 3 and the resonator 10 are insulated acoustically from one another with the aid of a facility for acoustic insulation 15. According to the present example the facility 15 is a Bragg reflector with $\lambda/4$ thick layers of different acoustic impedance.

The following method steps are implemented to produce the capacitor structure 1 (FIG. 4): a) provision of the substrate, b) generation of the lower electrode layer on a substrate surface of the substrate, c) generation of the amorphous intermediate layer on the lower electrode layer, d) generation of the ceramic film with zinc oxide on the intermediate layer and e) generation of the upper electrode layer on the crystalline piezoelectric layer with zinc oxide. The substrate 3 is held with the aid of the substrate support 32. The individual layers are generated respectively by magnetron sputtering. To generate the zinc oxide layer elementary zinc is used as the source (target) 9 for zinc oxide single crystals. The source is held by the source support 91, which is arranged in the support gap 52 in relation to the source support 32. Zinc oxide forms in the $Ar^+$ ion plasma of the magnetron sputter unit in the present of oxygen. In an alternative embodiment zinc oxide is used as the source 9. To generate the polycrystalline ceramic film from zinc oxide a shutter 7 is inserted between the source 9 (target) and the substrate surface 31. In a first embodiment the source consists of elementary zinc. The shutter 7 shades off certain angles of incidence of the zinc oxide single crystals. A swinging movement 61 of the substrate 3 is carried out with the aid of the facility 62 during deposition. In an alternative embodiment a swinging movement of the shutter 7 is carried out. In each instance the gap 51 and the support gap 52 remain essentially the same. A homogeneous zinc oxide film 2 results with zinc oxide single crystals, which have a preferred orientation. The preferred orientation is characterized by an angling of the c-axis of the zinc oxide single crystals through 16° toward the surface normal of the substrate surface 31.

Figure 2:
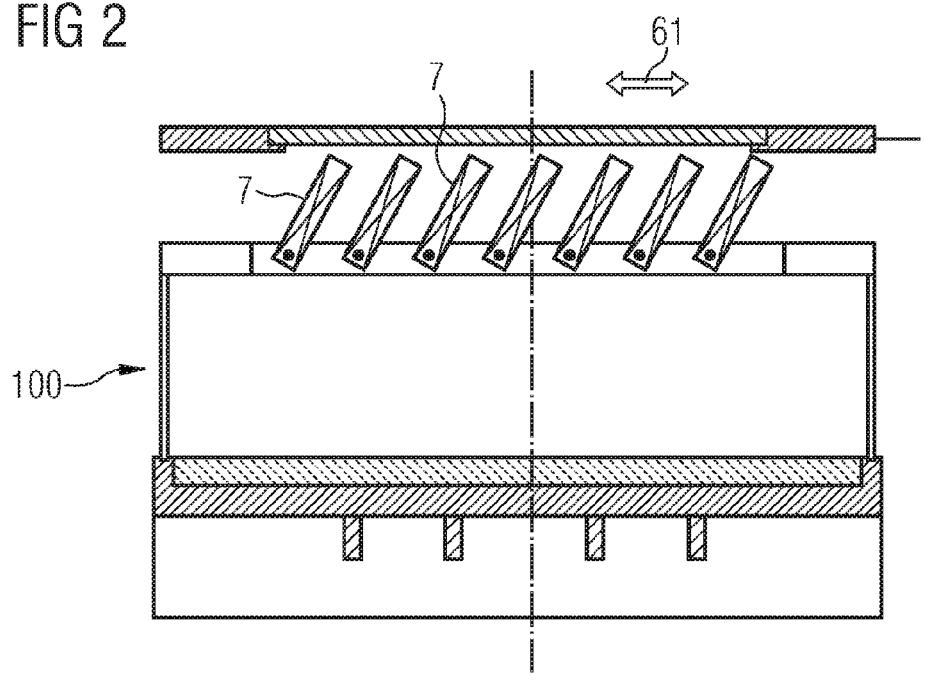
FIG. 2 shows a device for producing a polycrystalline ceramic film with a number of shutters from the side.
Figure 3:
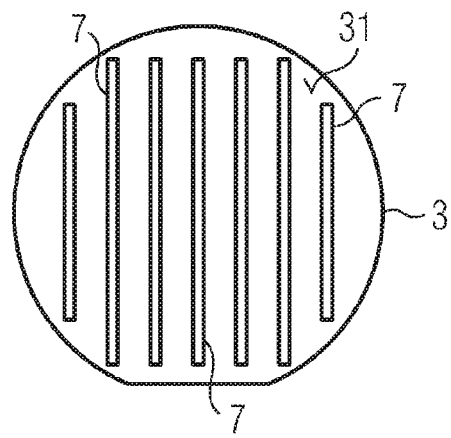
FIG. 3 shows an arrangement of a number of shutters on a substrate surface of a substrate viewed from above.

Further exemplary embodiments emerge in that a polycrystalline ceramic film is produced from aluminum nitride instead of zinc oxide and a number of shutters are positioned in the particle stream 8 (FIGS. 2 and 3).

A plurality of resonators 10 are obtained from the substrate by means of separation based on the capacitor structure 1. Since the ceramic film is homogeneous over the entire substrate, the resonator yield is very high.

These resonators 10 are used to detect a substance in a fluid 15 in the form of a liquid. To detect the substance in the fluid 15 in a first step the chemically sensitive surface segment 12 of a resonator 10 and the fluid 13 are brought together. The fluid 13 and the resonator 10 are brought together in such a manner that the substance in the fluid 13 can be absorbed on the surface segment 12 of the resonator 10. Absorption changes the mass of the resonator 10. Subsequent measurement of the resonant frequency of the resonator 10 makes it possible to conclude the type of substance and its concentration in the fluid 13. Absorption of the substance causes the resonant frequency of the resonator 10 to change compared with the resonant frequency of the resonator 10, on whose surface segment 12 no substance is absorbed. In order to be able to determine the change in the resonant frequency, a resonator 10 with a known resonant frequency is used. In an alternative embodiment the resonant frequency of the resonator is determined without absorbed substance before the fluid and resonator are brought together.

The invention claimed is:

1. A device for producing a polycrystalline ceramic film on a substrate surface of a substrate, the device comprising:
    at least one source support that holds a source for ceramic particles of the ceramic film,
    at least one substrate support that holds the substrate in a support gap in relation to the source support,
    an array of shutters arranged between the source support and the substrate support, the an array of shutters defining an array of openings between adjacent shutters and configured to adjust a mean angle of incidence of ceramic particles reaching the substrate surface by allowing ceramic particles to reach the substrate surface at certain angles of incidence through the array of openings between adjacent shutters and blocking ceramic particles from reaching the substrate surface at other angles of incidence, and
    a device for laterally swinging the array of shutters or the substrate to provide parallel relative movement between the array of shutters and the substrate during a deposition process.

2. The device according to claim 1, wherein the mean angle of incidence is adjustable within a range from 0° to 90° inclusive.

3. The device according to claim 2, wherein the mean angle of incidence is adjustable within a range from 0° to 30° inclusive.

4. The device according to claim 1, wherein a gap between the substrate surface and the source of the ceramic particles is smaller than a mean free path length of the ceramic particles of the particle stream.

5. The device according to claim 1, wherein the shutter is configured to adjust an electric field that is used to help to influence the angle of incidence.

6. The device according to claim 1, wherein the ceramic film is produced with a ceramic comprising at least one of aluminum nitride and zinc oxide.

7. The device according to claim 1, wherein the substrate surface comprises an amorphous substrate surface.

8. The device according to claim 7, wherein the substrate is formed by at least one material selected from the group consisting of aluminum oxide, silicon dioxide, titanium dioxide and zirconium dioxide.

9. A device for producing a polycrystalline ceramic film on a substrate surface of a substrate, the device comprising:
    at least one source support that holds a source for ceramic particles of the ceramic film,
    at least one substrate support that holds the substrate in a support gap in relation to the source support,
    at least one shutter arranged between the source support and the substrate support, the at least one shutter configured to adjust a mean angle of incidence of the ceramic particles in relation to a surface normal to the substrate surface of the substrate supported by the substrate support, and
    a device for swinging the at least one shutter or the substrate to provide a relative movement between the at least one shutter and the substrate during a deposition process,
    wherein the shutter is configured to adjust an electric field that is used to help to influence the angle of incidence.

10. The device according to claim 9, wherein the mean angle of incidence is adjustable within a range from 0° to 90° inclusive.

11. The device according to claim 10, wherein the mean angle of incidence is adjustable within a range from 0° to 30° inclusive.

12. The device according to claim 9, wherein a gap between the substrate surface and the source of the ceramic particles is smaller than a mean free path length of the ceramic particles of the particle stream.

13. The device according to claim 9, wherein the shutter is configured to adjust an electric field that is used to help to influence the angle of incidence.

14. The device according to claim 9, comprising a plurality of shutters arranged between the substrate surface of the substrate and the source of the ceramic particles.

15. The device according to claim 9, wherein the ceramic film is produced with a ceramic comprising at least one of aluminum nitride and zinc oxide.

16. The device according to claim 9, wherein the substrate surface comprises an amorphous substrate surface.

17. The device according to claim 16, wherein the substrate is formed by at least one material selected from the group consisting of aluminum oxide, silicon dioxide, titanium dioxide and zirconium dioxide.

* * * * *